(12) United States Patent
Shirotori et al.

(10) Patent No.: US 7,618,549 B2
(45) Date of Patent: Nov. 17, 2009

(54) METHOD OF FORMING PATTERNS AND METHOD OF MANUFACTURING MAGNETIC RECORDING MEDIA

(75) Inventors: Satoshi Shirotori, Fuchu (JP); Yoshiyuki Kamata, Tokyo (JP); Masatoshi Sakurai, Tokyo (JP); Akira Kikitsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 607 days.

(21) Appl. No.: 11/580,862

(22) Filed: Oct. 16, 2006

(65) Prior Publication Data

US 2007/0090087 A1    Apr. 26, 2007

(30) Foreign Application Priority Data

Oct. 26, 2005    (JP) .............................. 2005-311594

(51) Int. Cl.
*B44C 1/22* (2006.01)
(52) U.S. Cl. .............................. 216/22; 216/44; 216/46; 216/58; 216/75
(58) Field of Classification Search .................. 216/22, 216/44, 46, 58, 75
See application file for complete search history.

(56) References Cited

U.S. PATENT DOCUMENTS 5,994,226 A    11/1999    Kadomura

| | | | |
|---|---|---|---|
| 7,352,529 B2 * | 4/2008 | Hibi et al. .................... 360/135 |
| 7,365,103 B2 * | 4/2008 | Willson et al. ................. 522/31 |
| 2004/0209470 A1 * | 10/2004 | Bajorek ....................... 438/689 |
| 2005/0064057 A1 * | 3/2005 | Morita .................... 425/192 R |
| 2006/0076509 A1 * | 4/2006 | Okino et al. ............. 250/492.2 |

FOREIGN PATENT DOCUMENTS

JP    6-93442 B2    11/1994
JP    2003-263794    9/2003

OTHER PUBLICATIONS

C. Gourgon at al., "Influence of Pattern Density in Nanoimprint Lithography", J. Vac Sci. Technol B 21(1), Jan./Feb. 2003.

* cited by examiner

*Primary Examiner*—Binh X Tran
(74) *Attorney, Agent, or Firm*—Pillsbury Winthrop Shaw Pittman, LLP

(57) ABSTRACT

According to one embodiment, a method of forming patterns is provided, in which the method including forming a resist on an underlying material, pressing a stamper having patterns of protrusions and recesses, sidewalls of which protrusions are tapered, onto the resist to form a patterned resist having patterns of protrusions and recesses, sidewalls of which protrusions are tapered, forming a protective film on the patterned resist, performing anisotropic etching to leave the protective film on the tapered sidewalls of protrusions of the patterned resist, etching a resist residue remaining in recesses of the patterned resist using the protective film as a mask, and etching the underlying material using the protective film and the patterned resist as a mask.

12 Claims, 4 Drawing Sheets

METHOD OF FORMING PATTERNS AND METHOD OF MANUFACTURING MAGNETIC RECORDING MEDIA

CROSS-REFERENCE TO RELATED APPLICATIONS

This application is based upon and claims the benefit of priority from Japanese Patent Application No. 2005-311594, filed Oct. 26, 2005, the entire contents of which are incorporated herein by reference.

BACKGROUND

1. Field

One embodiment of the present invention relates to a method of forming patterns and a method of manufacturing a magnetic recording media.

2. Description of the Related Art

Due to significant progress in functions of information equipment such as personal computers in recent years, the amount of information a user deals with is significantly increasing. In such a condition, an information recording and reproducing device with a remarkably higher information density than before and a highly integrated semiconductor device are demanded. As for a hard disk drive (HDD), which is a magnetic device, there is proposed a discrete track recording media (DTR media) in which recording tracks are separated physically with a nonmagnetic material or a groove in order to improve the recording density. Because phenomena such as the side-erase phenomenon in recording and the side-read phenomenon in reproducing can be decreased in the DTR media, it is possible to increase track density, and a magnetic recording media which enables high density recording can be provided. Further, when servo information is formed together as patterns in the DTR media, there is no need to write in servo signals with a magnetic head, which requires a long period of time. On the other hand, when the servo information is not formed as designed patterns, servo tracking becomes difficult. Therefore, a finer and more accurate fabrication technique becomes necessary in order to improve the recording density.

An example of a microfabrication technique is conventional photolithography using an exposure process which enables microfabrication of a large area at once. However, it is difficult to manufacture a fine structure of 400 nm or less because it does not have resolution for a wavelength of light or less. Although examples of the microfabrication technology of a level of 400 nm or less include electron-beam lithography and focused ion beam lithography, low throughput is a problem, and further, there is a problem that the lithography device becomes expensive as miniaturization proceeds.

In contrast, nanoimprint lithography proposed by Chou et al. is inexpensive and attractive as a fabrication technique having a resolution of about 10 nm (U.S. Pat. No. 5,772,905). Chou et al. use a stamper in which patterns have been formed by electron beam lithography and reactive ion etching (RIE). First, a film of polymethyl methacrylate (PMMA), which is a thermoplastic resin, is formed on a silicon substrate as a resist. A thermal cycle nanoimprint is performed using the above-described stamper and patterns are transferred onto the resist. Residues remaining at the bottom of recesses of the resist patterns are removed with oxygen RIE to expose the surface of silicon. Then, for example, microfabrication of the substrate is performed by etching using the resist patterns as a mask, and after a film of Al and the like is formed, wiring is formed by lifting off the metal film.

Examples of an imprint method include generally a UV type imprint method (in which an ultraviolet (UV) curing resin is used), a hot embossing type imprint method, and a high pressure type imprint method at room temperature. Although the UV type enables highly precise patterns to be formed, there is a problem in the uniformity of the resist thickness because fluidity of the resist before the UV curing is high, and fluctuation of the flatness of the stamper and the substrate affect the resist thickness directly. Further, stamper has a problem that the cost is high because of its necessity to have UV-transmisivity. In the hot embossing type, distortion by contraction occurs easily because of heating, and throughput is not good due to heating and cooling steps. Further, the uniformity of the thickness is also a problem like the UV type because fluidity of the resist is high at heating.

Accordingly, considering mass-productivity and uniformity of the resist thickness, the high pressure type imprint at room temperature in which a pattern formation is performed at high pressure without heating, so that nonuniformity of thickness between the substrate and the stamper is canceled by applying a high pressure, is preferable. However, in the case of using the high pressure type imprint, there occurs a problem that the amount of the resist displaced by protrusions of the patterns and filling recesses of the patterns varies depending on the area ratio of recesses to protrusions in each pattern area of the stamper (J. Vac. Sci. Technol. B21, 98 (2003)). A DTR media has data areas including recording tracks, and servo areas including an address portion, a preamble portion and a burst portion, in which the area ratio of magnetic material is different in each area. Accordingly, the area ratio of recesses to protrusions of the pattern is different in each area of the stamper for manufacturing a DTR media. As a result, under the condition that the stamper is pushed into the resist at its maximum, difference in thickness of the resist residue remaining in recesses of the resist occurs depending on the area ratio of recesses to protrusions of the stamper.

When dispersion in the thickness of the resist residue occurs, a problem occurs when the resist residue is removed by RIE. That is, the resist residue with thin thickness is removed earlier than the resist residue with thick thickness is removed, and side-etching occurs excessively at these locations. As a result, variation in size between the patterns in the stamper and the patterns transferred onto the resist occurs. The variation in patterns size is different in each area.

Accordingly, although attempts to adjust the resist residue by changing viscosity of the resist, imprint time, and imprint temperature are performed, these methods are not effective countermeasures.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the present invention, there is provided a method of forming patterns, comprising: forming a resist on an underlying material; pressing a stamper having patterns of protrusions and recesses, sidewalls of which protrusions are tapered, onto the resist to form a patterned resist having patterns of protrusions and recesses, sidewalls of which protrusions are tapered; forming a protective film on the patterned resist; performing anisotropic etching to leave the protective film on the tapered sidewalls of protrusions of the patterned resist; etching a resist residue remaining in recesses of the patterned resist using the protective film as a mask; and etching the underlying material using the protective film and the patterned resist as a mask.

Figure 1:
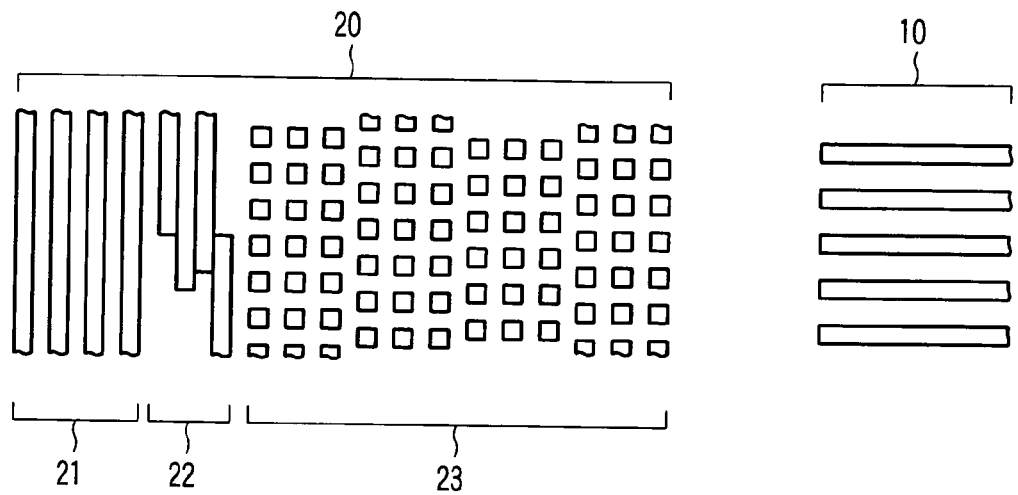
FIG. 1 is a plan view showing one example of patterns of data areas and servo areas of a DTR media.

FIG. 1 is a plan view showing one example of patterns of servo areas and data areas along the circumferential direction of the DTR media. When the DTR media is fitted into a drive, a head moves from left to right relatively to the media.

In FIG. 1, data areas 10 includes recording tracks made of a magnetic material and guard bands made of a nonmagnetic material. The recording tracks and guard bands extend in the circumferential direction of the media. Each recording track is separated by a guard band and is arranged in a constant period (track pitch $T_p$). The ratio of the width of a recording track to the width of a guard band is set at 2:1. Therefore, the area ratio of magnetic material in the data areas 10 is about 67%.

The servo areas 20 are, as described previously, roughly divided into a preamble portion 21, an address portion 22, and a burst portion 23. Hereinafter, the roles of these areas will be explained in details.

The preamble portion 21 is provided for performing a phase-locked loop (PLL) process for synchronizing a servo signal reproduction clock and an automatic gain control (AGC) process for keeping the signal reproduction amplitude appropriately with respect to a time lag arising from rotation decentering and the like of a media. The preamble portion 21 is formed of patterns in which magnetic materials and non-magnetic materials are repeatedly arranged alternately in the circumferential direction, and the magnetic materials and the nonmagnetic materials extend radially in the radial direction so as to form circular arcs. A ratio of magnetic material to the nonmagnetic material in the preamble portion 21 is approximately 1:1. Namely, the area ratio of magnetic material in the preamble portion 21 is approximately 50%. Meanwhile, the repetition cycle in the circumferential direction varies in proportion to the radial distance. However, it is a visible wavelength or less even at the outermost circumference, and it is difficult to identify the servo areas by optical diffraction, like the data area 10.

The address portion 22 has a servo signal recognition code called servo mark, sector information, cylinder information and the like, which are formed in Manchester code in the same pitch as the circumferential pitch of the preamble portion 21. In particular, the cylinder information is formed as patterns whose information changes per servo track. For this reason, code conversion called Gray code where the change from adjacent tracks becomes minimum is carried out such that the influence of address reading mistakes at seek operation becomes small, and then, the information is recorded in Manchester code. The occupancy rate of magnetic material of this area is approximately 50%.

The burst portion 23 is an off-track detection area for detecting an off-track amount from an on-track state of a cylinder address. Patterns of four marks called A, B, C and D bursts, among which there are pattern phases lag in the radial direction, are formed. In the respective bursts, plural marks are arranged in the circumferential direction at the same pitch as that in the preamble portion. The cycle of each burst in the radial direction is in proportion to the cycle of the address pattern, i.e., the servo track cycle. For example, a pattern is formed in which each burst mark is formed for 10 cycles in the circumferential direction and is repeated at twice the cycle of the servo track cycle in the radial direction. Since the burst marks are formed of a nonmagnetic material, the area ratio of magnetic material in the ABCD burst is approximately 75%.

Although the ABCD burst is explained as an example of the burst portion 23 in FIG. 1, patterns may be formed to perform phase difference servo control. The area ratio of magnetic material in the phase difference servo pattern is about 50%.

As described above, the area ratio of magnetic material in each area of the DTR media to be manufactured is different. Corresponding to the difference of the area ratio of magnetic material in each area, the area ratio of recesses to protrusions of the stamper for manufacturing the DTR media is also different. The difference of the area ratio of recesses to protrusions between the pattern areas of the stamper produces dispersion of the thickness of the resist residue depending on the pattern area. Because of the dispersion, excessive side-etching occurs and size of the patterned resist varies. The inventors of the present invention have discovered that the above-described problems can be solved by forming a protective film having etching resistance on the sidewalls of protrusions of the patterned resist, to prevent side-etching.

One example of a method of manufacturing a DTR media according to the present invention is shown in FIGS. 2A to 2H.

Figure 2A:
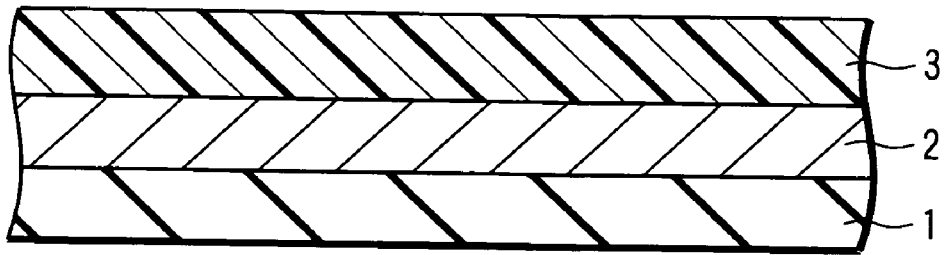
FIGS. 2A, 2B, 2C, 2D, 2E, 2F, 2G, and 2H are cross-sectional views showing one example of a method of manufacturing a DTR media according to the present invention.

As shown in FIG. 2A, a magnetic film 2 is formed on a substrate 1. Examples of the substrate 1 include lithium based crystallized glass. An example of the magnetic film 2 is a so-called perpendicular double-layer media having a perpendicular magnetic recording layer on a soft underlayer with high permeability. Examples of soft magnetic materials include CoZr, CoZrNb, and CoZrTa based alloys. Examples of the recording layer include CoCrPt. Further, an intermediate layer made of a nonmagnetic material may be arranged between the soft underlayer and the recording layer to cut off the exchange coupling interaction between the soft underlayer and the recording layer and to control crystallinity of the recording layer. Ru, Pt, Pd, W, Ti, Ta, Cr, Si, alloys including these elements, and their oxides and nitrides can be used as materials of the intermediate layer. However, structure of the magnetic film 2 is not limited to these.

Next, a resist 3 for imprint is formed on the magnetic film 2. A resist, which is suitable for a process such as etching after the imprint process, is selected as the resist 3 depending on the high density recording media to be manufactured. Further, it is required that the resist is softer than the stamper material so that patterns of protrusions and recesses on the surface of the stamper can be transferred certainly at imprinting, and that it has stability to preserve the patterns of protrusions and recesses transferred after imprinting at room temperature. Therefore, the glass transition temperature and the melting point of the resist are above room temperature. To be more concrete, it is desired that the resist is soft enough to be able to transfer the patterns of protrusions and recesses of the stamper at a load of 500 bar and more, and it is desired that its glass transition temperature is 100° C. or less. Therefore, although examples of the resist are photoresists such as a novolac resin used in semiconductor processes and a spin glass (SOG), it is not limited to these.

Figure 2B:
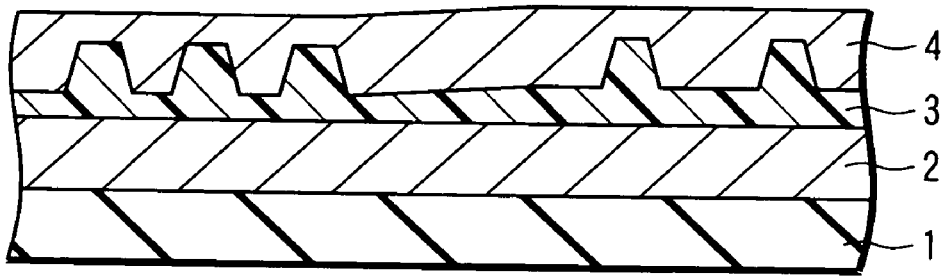

As shown in FIG. 2B, patterns are transferred by pressing a stamper 4 onto the resist 3. The stamper 4 is, for example, made of nickel. The stamper 4 has patterns whose protrusions and recesses are reversed from the patterns of protrusions and recesses to be transferred and has a different area ratio of recesses to protrusions in each pattern area. In order to obtain a good releasing property of the stamper, the sidewalls of protrusions in the stamper are tapered. Further, the process to improve the releasing property of the stamper is normally performed. By pressing the stamper the sidewalls of which protrusions are tapered onto the resist 3, the sidewalls of protrusions of the patterns to be transferred to the resist 3 are tapered.

Figure 2C:
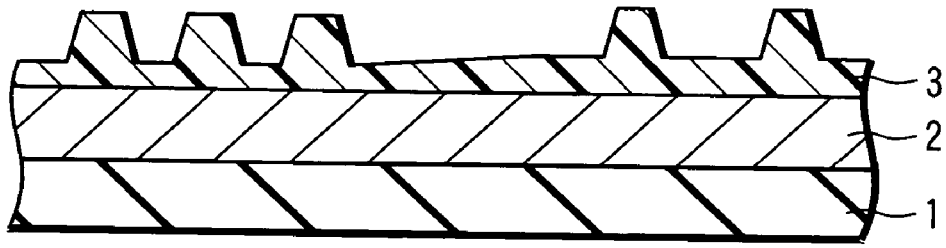

When the stamper is pressed at imprinting, the inside of recesses in an area where the area ratio of recesses to protrusions of the stamper is low (the right-side area in FIG. 2B) is filled with resist first and the protrusions will not be able to be pressed in any farther. At this point, because recesses in an area where the area ratio of recesses to protrusions of the stamper is high (the left-side area in FIG. 2B) are not filled with resist, there is room for the protrusions being pressed in. When the pressing is continued, the stamper is slightly distorted, the protrusions are pressed in farther in an area where the area ratio of recesses to protrusions of the stamper is high, and the recesses in this area are also filled with resist. In this manner, how far the protrusions are pressed in varies depending on the area ratio of recesses to protrusions in each area of stamper, and differences in the thickness of the resist residue occur. The state after the stamper 4 is removed is shown in FIG. 2C.

Figure 2D:
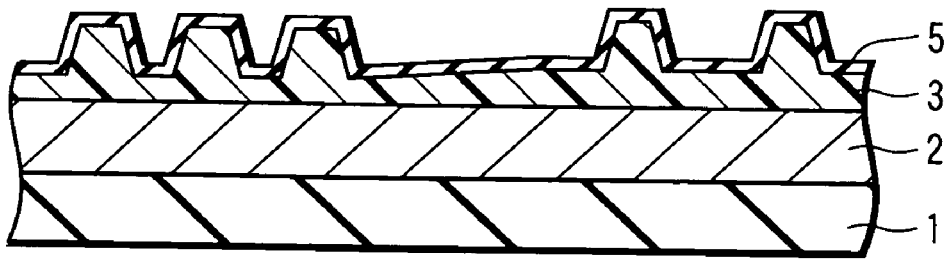

As shown in FIG. 2D, a protective film 5, to protect the transferred pattern form, is formed on the patterned resist 3. A material, having a higher etching resistance than the resist 3 regarding etching at removal of the resist residue described later, is used for the protective layer 5. Here, although the difference in etching resistance is the difference in physical resistance toward milling, etc., that is a difference in hardness, and a difference in chemical resistance toward RIE, etc., that is the difference in reactivity, it is not especially limited. Although examples of a material of the protective film 5 include a metal film (for example, Ti, Ta, W, Pt, and Al), a metal oxide film (for example, $TiO_2$ and $Al_2O_3$), a metal compound (for example, AlTi), an inorganic material (for example, $SiO_2$ and C), an organic polymer (for example, a general photoresist), and a low-molecular organic compound, it is not especially limited as long as it meets the above-described condition.

Further, in the case of fabricating fine patterns of 400 nm or less, the thickness of the protective film 5 is preferably 1 nm to 15 nm. When it is 1 nm or less, a film with good film quality cannot be formed along with the patterns, and the etching resistance is not good. In contrast, when it is 15 nm and more, it becomes difficult to form a film along with the patterns. Further, because the etching time increases, the process time itself gets longer.

An example of a method of forming the protective film 5 is a sputtering method. The sputtering is good in mass-productivity and can provide a film with good quality. Here, in the case of using a resist such as a photoresist, which enables etching with oxygen, as a resist for imprinting, $SiO_2$, which enables etching with fluorine based gas such as $CF_4$ and $SF_6$, is preferably formed by sputtering. Further, in the case of using a resist such as a SOG which enables etching with fluorine based gas, as a resist for imprinting, carbon, which enables etching with oxygen, is preferably formed by sputtering as the protective film.

Dipping can be used as another method of forming the protective film. In dipping, the protective film can be formed along with the patterns for a plurality of media at once. Here, in the case of using a photoresist, which enables etching with oxygen, as the resist, a SOG, which enables etching with fluorine based gas such as $CF_4$ and $SF_6$, is preferably dipped as a protective film. Further, in the case of using a SOG, which enables etching with fluorine based gas, as a resist, a novolac resin (photo resist), which enables etching with oxygen, is preferably dipped as a protective film. Because the protective film to be dipped is not adsorbed chemically into the resist, the pull-up speed should be decreased to suppress vibration of the liquid surface.

The method of forming the protective film 5 is not limited to these two methods and spray coating, inkjet coating, etc. can be used. Among these methods of forming a protective film, dipping is preferable in the mass production aspect.

Figure 2E:
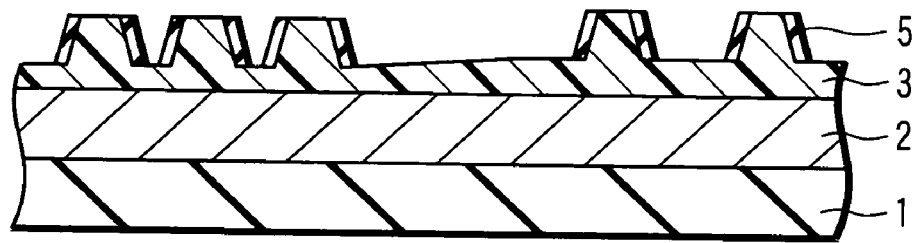

As shown in FIG. 2E, by anisotropic etching of the protective film 5, the protective film 5 is left on the tapered sidewalls of protrusions of the patterned resist 3. In the anisotropic etching, in the case that protective film has no anisotropy such as crystal anisotropy, it is preferred to make a mean free path of an ion long. The method of anisotropic etching may be selected from methods such as ion milling and RIE depending on difference of the etching resistances of the protective film 5.

Figure 2F:
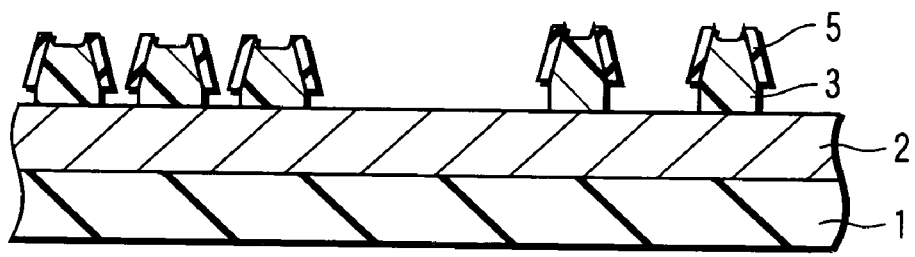

As shown in FIG. 2F, resist residue remaining in recesses of the patterned resist 3 is etched by using the protective film 5 remaining on the sidewalls of protrusions of the resist 3 as a mask. Performing anisotropic etching using methods such as RIE and inductively coupling plasma (ICP) is preferable for removing the resist residue. Because the sidewalls of protrusions of the patterns are protected by the protective film 5 having a higher resistance against the etching used in this step than the resist 3, the resist 3 other than that on the sidewalls of protrusions is etched. In this step, although the resist residue in an area where the thickness of the resist residue is thin is removed earlier than the resist residue in an area where the thickness is thick, it is necessary to continue the etching until the resist residue in the area where a thickness is thick is removed. Although etching using reactive ions generally shows anisotropy, side-etching occurs at the time when the resist residue is removed. However, in the present invention, the resist residue can be removed in all pattern areas having a different area ratio of protrusions to recesses without side-etching because the sidewalls of protrusions of the pattern are protected by the protective film 5 having a higher etching resistance than the resist 3. Because of this, variation of the pattern size from the pattern size of the stamper, which is a designed value, can be suppressed independent of the area.

Figure 3A:
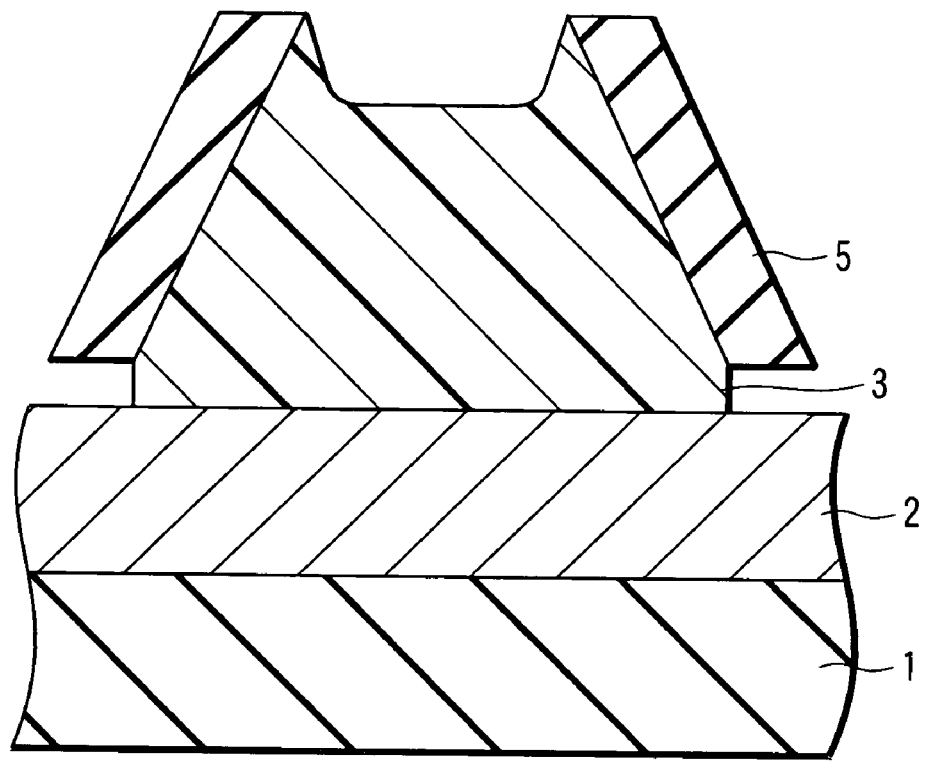
FIGS. 3A and 3B are enlarged cross-sectional views of the etching mask shown in FIG. 2F.

Because the top of the patterned resist 3 is etched by removing the resist residue with anisotropic etching, the form of protrusions becomes the form shown in FIG. 3A. FIG. 3A is an enlarged view of one of the protrusions shown in FIG. 2F. As shown in FIG. 3A, the position at the top of the protective film 5 is higher than the position at the top of the resist 3 because the protective film 5 has high resistance against the etching at removing of resist residue, and etching does not proceed while the top of the protrusions of the resist 3 is etched.

Figure 2G:
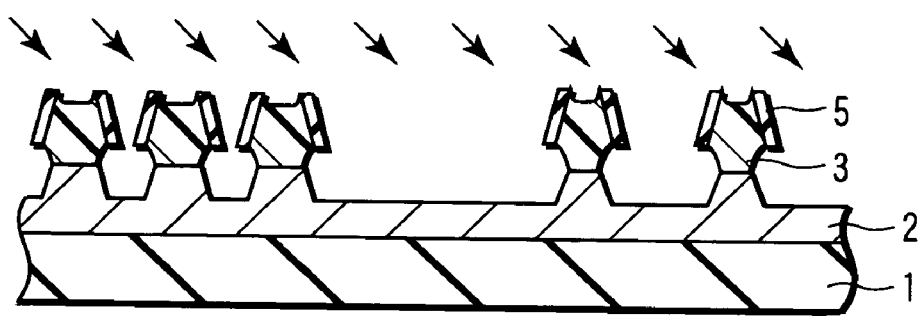

As shown in FIG. 2G, the magnetic film 2 is etched using the protective film 5 and the patterned resist 3 as a mask. Ar ion milling, for example, is used for fabrication of the magnetic film 2. At this time, etching with ion milling is performed by setting the ion incident angle to 30° and 70° so that the re-deposition can be suppressed to eliminate damage of the ferromagnetic recording layer. In order to suppress the re-deposition, by performing etching with the high angles, the sidewalls of the patterns of the magnetic film become tapered at about 40° to 75°.

Figure 3B:
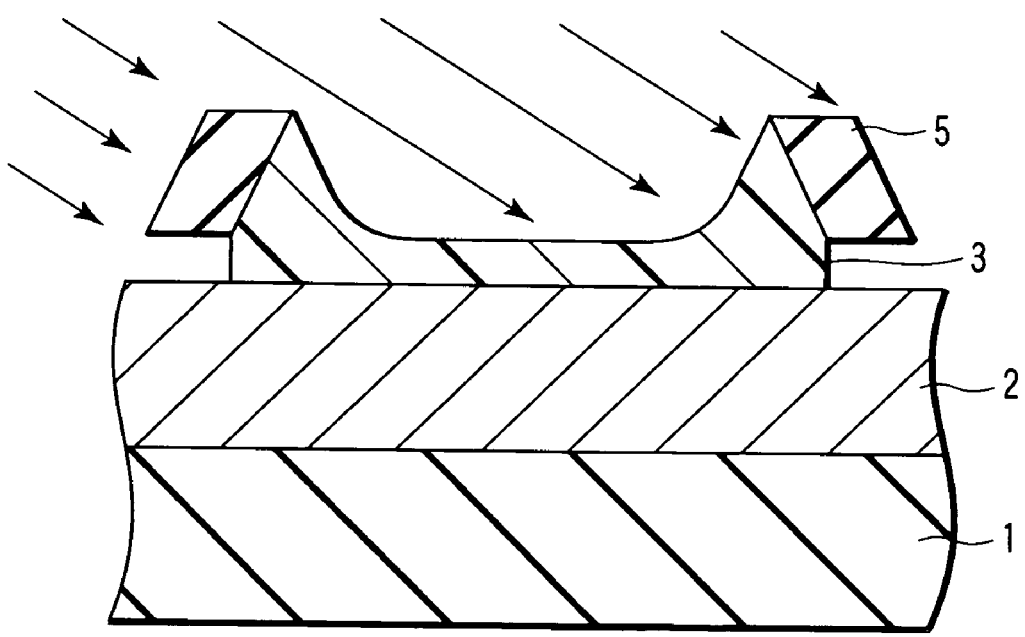

The etching mask, the structure of which is shown in FIG. 3A, manufactured with the method of forming patterns of the present invention, causes a favorable effect at fabrication by etching with high angles. Normally, the resist forming the protrusions of the patterns, which becomes an etching mask, is removed partially when the resist residue is removed and etching resistance decreases. However, because the position at the top of the protective film 5 protecting the sidewalls of protrusions of the patterns is higher than the position at the top of the resist 3, the etching resistance against etching from the high angles does not decrease even when the top of the resist 3 is etched. Therefore, as shown in FIG. 3B, the etching resistance against etching from high angles of the mask including the protective film 5 and protrusions of the resist can be improved.

Figure 2H:
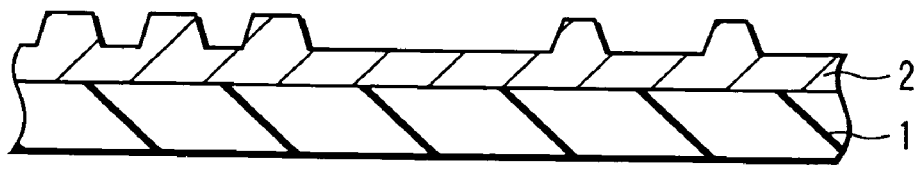

As shown in FIG. 2H, the resist 3 used as an etching mask is removed together with the protective film 5. Removal of the resist 3 is performed with a removing method suitable for the material of the resist 3. Although an example of the removing method is removal by $SF_6$ gas using an ICP etching machine in the case of using SOG as the resist 3, it is not limited to this. As occasion demands, a process removing impurities on the surface of the magnetic film processed such as washing with water may be performed.

Furthermore, steps included in the normal method of manufacturing a DTR media such as formation of a flattening film made of a nonmagnetic material, an etch-back process for flattening, formation of a protective film, and coating with a lubricant layer are performed for manufacturing a magnetic recording media (not shown).

As described above, when a DTR media is manufactured using the method of the present invention, excessive side-etching at removal of the resist residue can be suppressed and variation of the pattern size after manufacturing the media from the pattern size of the stamper which is a designed value, can be decreased independent of the area.

Although the present invention is explained above with a method of manufacturing a DTR media as an example, the method of forming patterns in the present invention is not limited to this and it is obvious that it can be applied to other microfabrication methods using the high pressure type imprint method. Examples of other microfabrication methods include a method of fabricating a silicon substrate used in a semiconductor device.

EXAMPLES

The present invention is explained specifically using examples below.

Example 1

A DTR media was manufactured using the method of the present invention shown in FIG. 2.

A lithium based crystalline glass substrate of 2.5 inches in diameter was used as the substrate 1. After washing the substrate 1, it was introduced into a sputtering machine and the magnetic layer 2 was formed by depositing a soft underlayer, an intermediate layer, and a recording layer in this order. The above-described materials were used for the soft underlayer and the intermediate layer. CoCrPt was used for the recording layer.

Next, SOG (trade name: OCD T-7 8000T, manufactured by Tokyo Ohka Kogyo Co. Ltd.) was spin-coated at 6000 rpm on the magnetic layer 2 as the resist 3. Then, pre-baking was performed at 100° C. for 20 minutes and the SOG was made to have a suitable hardness for imprinting.

On the other hand, the stamper 4 to transfer patterns to the resist (SOG) 3 was prepared. The stamper 4 to be used has stamper patterns corresponding to the servo areas (including an address portion and a preamble portion (the area ratio of recesses to protrusions is 50%), and a burst portion (the area ratio of recesses to protrusions is 75%)) and data areas (the area ratio of recesses to protrusions is 67%). The depth of recesses of the stamper is 90 nm.

To perform the imprinting, the stamper 4 was dipped in a perfluoroalkyl derivative which is a fluorine based parting agent and the releasing property at imprinting was enhanced. First, in order to increase adhesiveness between the perfluoroalkyl derivative and the stamper made of nickel, the stamper was oxidized in an asher at 40° C. and more for 5 minutes. Then, the stamper was coated with the perfluoroalkyl derivative using a louver containing a solution obtained by diluting perfluoropolyether ($HOOC-CF_2-O-(CF_2-CF_2-O)_m-(CF_2-O)_n-(CF_2-COOH)$) as a perfluoroalkyl derivative with GALDEN-HT70 (manufactured by Solvay Solexis company). Lastly, the stamper 4 was annealed at 150° C. for 10 minutes in a nitrogen environment.

By pressing the processed stamper 4 onto the resist 3 (SOG) at 2000 bar for 1 minute, its patterns were transferred to the resist 3. The depth of recesses of the resist 3 after the pattern transfer was about 80 nm and the thickness of the resist residue was about 50 nm.

After transferring the patterns, the substrate was placed in a sputtering machine and carbon of 10 nm thickness as the protective layer 5 was formed along with the transferred patterns.

After forming the protective layer 5, the protective layer 5 was left on the sidewalls of protrusions of the resist 3 by RIE using oxygen gas. Then, the resist residue was removed by RIE using $SF_6$ gas. The RIE was performed by using an ICP etching machine at etching pressure of about 2 mTorr.

After removing the resist residue, the magnetic film was etched by Ar ion milling. At this time, the etching by Ar ion milling was performed by setting the ion incident angle to 30° and 70° so that re-deposition can be suppressed to eliminate damage of the ferromagnetic recording layer. As a result, the sidewalls of protrusions of the magnetic film 2 were tapered at about 40° to 75°.

After fabricating the magnetic film, SOG, which is the resist 3, was removed by RIE using $SF_6$ gas. At this time, the ICP etching machine was used as it is used for the removal of the resist residue. It was confirmed that carbon in the protective film 5 was lifted off together with the SOG of the resist 3. Then, washing with water was performed to remove fluoride attached to the surface.

Variation of the pattern size in a track, an address portion, and a burst portion of the manufactured DTR media from the pattern size of the stamper, which is a designed value, was compared and it was confirmed that there was hardly any variation independent on the area.

Next, a DTR media was manufactured using the same method as described above except changing the thickness of carbon of the protective film 5 to 0.5 nm, 1 nm, 2 nm, 5 nm, 15 nm, and 20 nm. Further, as a comparative example, a DTR media was manufactured by using the same method as described above except not forming the protective film 5.

Figure 4:
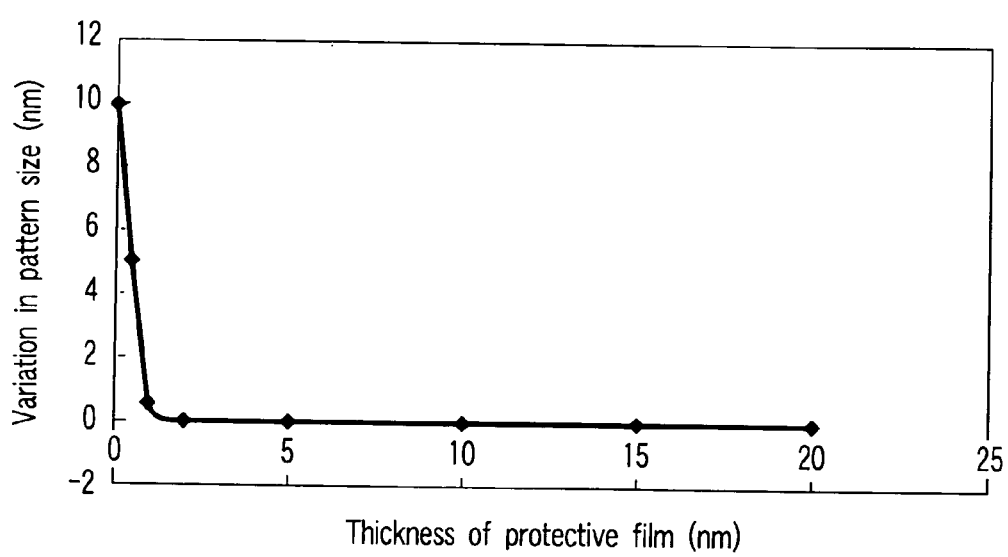
FIG. 4 is a graph showing the relationship between thickness of a protective film and variation of formed patterns size of the DTR media manufactured with the method of the present invention.

Variation of the pattern size of each manufactured DTR media from the pattern size of the stamper was examined. The relationship between thickness of the protective film and variation of the pattern size of the burst portion, where the area ratio of recesses to protrusions of the stamper is largest, is shown in FIG. 4. Here, variation of the pattern size of the burst portion is the absolute value of the deviation amount from the pattern size of the stamper when the removal of the resist residue was performed in the burst portion together with the track. An atomic force microscope (AFM) was used for the measurement. In the comparative example which is the case that there is no protective film, variation of the pattern size was 10 nm, and was the largest. Variation of the pattern size was observed in some degree, in which the thickness of the protective film was 1 nm or less. However, in the media in which the protective film was formed 1 nm and more, variation of the pattern size was not observed.

Next, the depths of recesses were compared with respect to the DTR media of Example 1 manufactured using a protective film with a thickness of 10 nm and the DTR media of Comparative Example 1 manufactured without the protective film. An AFM was used for the measurement. The depth of recesses in the DTR media manufactured in Comparative Example 1 was 25 nm. In contrast, the depth of recesses in the DTR media manufactured in Example 1 was 40 nm and recesses with a significant depth could be obtained. As explained above by using FIG. 3, this is because the resistance against etching from a high angle is improved by forming a protective film.

Example 2

The DTR media was manufactured using the same method as Example 1 except using a novolac photoresist (trade name: S1801, manufactured by Rohm and Haas Electronic Materials) as the protective film 5. By reducing the pull-up speed of the substrate (1 mm/min) when the novolac photoresist was formed by dipping, the substrate was coated with the photoresist along with the form of the patterns to form a protective film of 10 nm thickness.

Variation of the pattern size in a track portion, an address portion, and a burst portion of the manufactured DTR media from the pattern size of the stamper, which was a designed value, was compared and it was confirmed that there is hardly any variation, independent on the patterned area.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of forming patterns, comprising:
    forming a resist on an underlying material;
    pressing a stamper having patterns of protrusions and recesses, sidewalls of which protrusions are tapered, onto the resist to form a patterned resist having patterns of protrusions and recesses, sidewalls of which protrusions are tapered;
    forming a protective film on the patterned resist;
    performing anisotropic etching to leave the protective film on the tapered sidewalls of protrusions of the patterned resist;
    etching a resist residue remaining in recesses of the patterned resist using the protective film as a mask; and
    etching the underlying material using the protective film and the patterned resist as a mask.

2. The method according to claim 1, wherein the protective film is formed by sputtering.

3. The method according to claim 1, wherein the protective film is formed by dipping.

4. The method according to claim 1, wherein the protective film is formed by spray coating.

5. The method according to claim 1, wherein the protective film is formed by inkjet coating.

6. The method according to claim 1, wherein the protective film has a thickness of 1 nm to 15 nm.

7. The method according to claim 1, wherein the protective film is made of a metal selected from the group consisting of Ti, Ta, W, Pt, and Al.

8. The method according to claim 1, wherein the protective film comprises a metal oxide selected from the group consisting of $TiO_2$ and $Al_2O_3$.

9. The method according to claim 1, wherein the protective film is made of a metal compound.

10. The method according to claim 1, wherein the protective film comprises a material selected from the group consisting of an inorganic material, and an organic polymer compound.

11. The method according to claim 1, wherein a position of a top of the protective film is made to be higher than a position of a top of the patterned resist when the resist residue is etched.

12. A method of manufacturing a magnetic recording media, comprising:
    forming a magnetic film and a resist in this order on a substrate;
    pressing a stamper having patterns of protrusions and recesses, sidewalls of which protrusions are tapered, onto the resist to form a patterned resist having patterns of protrusions and recesses corresponding to servo areas including an address portion, a preamble portion and a burst portion, and data areas including a recording track, sidewalls of which protrusions are tapered;
    forming a protective film on the patterned resist;
    performing anisotropic etching to leave the protective film on the tapered sidewalls of protrusions of the patterned resist;
    etching a resist residue remaining in recesses of the patterned resist using the protective film as a mask; and
    etching the magnetic film using the protective film and the patterned resist as a mask.

* * * * *